(12) United States Patent
Yang et al.

(10) Patent No.: US 8,537,632 B2
(45) Date of Patent: Sep. 17, 2013

(54) METHOD OF ERASING SEMICONDUCTOR MEMORY DEVICE

(75) Inventors: Hea Jong Yang, Gyeonggi-do (KR); Hee Youl Lee, Gyeonggi-do (KR); Sung Jae Chung, Seoul (KR); Hyun Heo, Seoul (KR); Jeong Hyong Yi, Gyeonggi-do (KR); Yong Dae Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 295 days.

(21) Appl. No.: 13/095,156

(22) Filed: Apr. 27, 2011

(65) Prior Publication Data
US 2011/0261623 A1 Oct. 27, 2011

(30) Foreign Application Priority Data

Apr. 27, 2010 (KR) .................. 10-2010-0038961

(51) Int. Cl.
*G11C 7/00* (2006.01)

(52) U.S. Cl.
USPC .............. 365/218; 365/185.29; 365/185.18; 365/185.14; 365/185.28

(58) Field of Classification Search
USPC ............... 365/218, 185.29, 185.18, 185.14, 365/185.28
See application file for complete search history.

(56) References Cited

U.S. PATENT DOCUMENTS
2009/0080259 A1* 3/2009 Alrod et al. .............. 365/185.18

* cited by examiner

*Primary Examiner* — Jason Lappas
(74) *Attorney, Agent, or Firm* — IP & T Group LLP

(57) ABSTRACT

A method of erasing a semiconductor memory device comprises grouping a plurality of word lines of each memory block into at least two groups based on intensity of disturbance between neighboring word lines; performing an erase operation by applying a ground voltage to all word lines of a selected memory block and by applying an erase voltage to a well of the selected memory block; and first increasing the ground voltage of one group of the groups to a positive voltage during the erase operation.

7 Claims, 4 Drawing Sheets

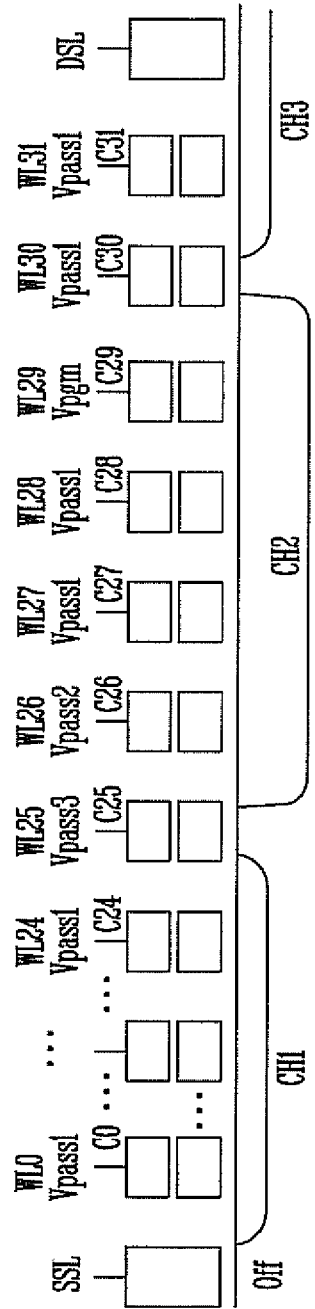

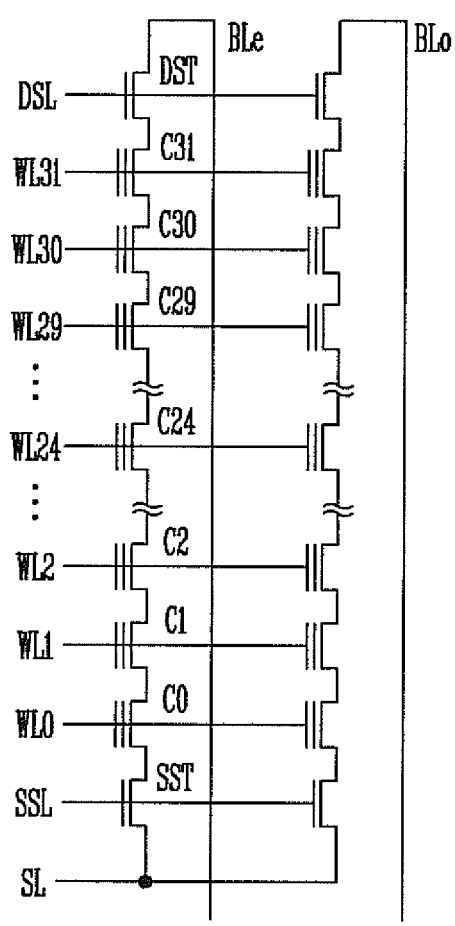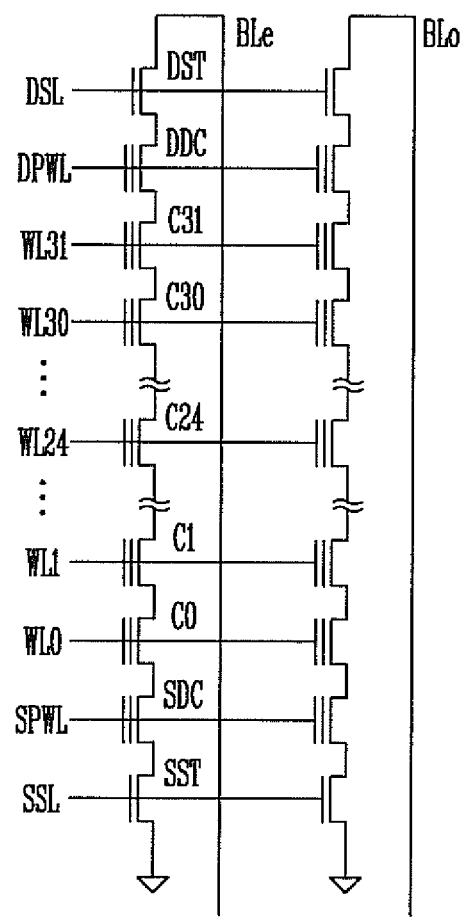

METHOD OF ERASING SEMICONDUCTOR MEMORY DEVICE

CROSS-REFERENCE TO RELATED APPLICATION

Priority to Korean patent application number 10-2010-0038961 filed on Apr. 27, 2010, the entire disclosure of which is incorporated by reference herein, is claimed.

BACKGROUND

Exemplary embodiments relate to a method of erasing a semiconductor memory device.

There is an increasing demand for nonvolatile memory devices which can be electrically programmed and erased and can retain data even without the supply of power. In order to develop high-capacity memory devices capable of storing a large amount of data, techniques for the high integration of memory cells are being developed. The nonvolatile memory device includes a memory cell array including a plurality of memory cell strings. Each of the memory cell strings includes a plurality of memory cells coupled in series.

A memory cell includes a gate and junctions formed on a semiconductor substrate on both sides of the gate. The gate has a structure in which a tunnel insulating layer, a floating gate, a dielectric layer, and a control gate are stacked over the semiconductor substrate. During a program operation, hot electrons are injected into the floating gate, and so a program is performed. During an erase operation, the electrons injected into the floating gate are discharged by means of F-N tunneling, and so erase is performed.

FIG. 1 is a cross-sectional view of a unit memory cell string of a nonvolatile memory device.

The unit memory cell string of the nonvolatile memory device includes memory cells coupled to $0^{th}$ to $31^{st}$ word lines WL0 to WL31, respectively, between a drain select line DSL and a source select line SSL.

In the nonvolatile memory device having the unit memory cell string structure, when a program operation is performed, a program voltage Vpgm is supplied to a selected word line, and a pass voltage Vpass is supplied to the remaining word lines.

FIG. 1 shows a case in which the $29^{th}$ word line WL29 is selected and supplied with the program voltage Vpgm, for a program. The program voltage Vpgm is supplied to the $29^{th}$ word line WL29, and the pass voltage Vpass is supplied to the remaining word lines.

Here, the program voltage Vpgm is supplied to not only the selected memory cell, but also other memory cells of other memory cell strings sharing the same word line, and so unselected memory cells sharing the same word line may be programmed. This phenomenon is called a program disturbance phenomenon.

In order to prevent the program disturbance phenomenon, during the time for which a program operation is performed by charging bit lines, coupled to the unselected memory cells, with a Vcc-Vth level (Vcc is a power supply voltage and Vth is the threshold voltage of a drain select transistor), the channel voltage Vch of the memory cell string is boosted so that the unselected memory cells are prevented from being programmed.

In this case, if the channel boosting level is low, F-N tunneling program disturbance may be generated. If the channel boosting level is high, program disturbance due to hot electron injection may be generated. Accordingly, a method of controlling the pass voltage Vpass supplied to the word line may be used for proper channel boosting.

Furthermore, channel boosting may be disturbed by the threshold voltage levels of memory cells adjacent to a selected memory cell. In order to address this concern, an erase area self-boosting method is used.

FIG. 2 is a diagram illustrating a state in which channel boosting is generated when voltage is supplied to a program-inhibited memory cell string in order to describe a program disturbance phenomenon generated due to an erase cell.

Referring to FIG. 2, in the memory cell string having the same structure as the memory cell string of FIG. 1, a $29^{th}$ word line WL29 is selected and supplied with a program voltage Vpgm, for performing a program operation.

In order to perform channel boosting for program inhibition, a third pass voltage Vpass3 is supplied to the $25^{th}$ word line WL25, and a second pass voltage Vpass2 is supplied to a $26^{th}$ word line WL26. A first pass voltage Vpass1 is supplied to the remaining word lines.

Here, the first pass voltage Vpass1 is 8V, the second pass voltage Vpass2 is 5 V, and the third pass voltage Vpass3 is 3 V.

As shown in FIG. 2, first to third channels CH1 to CH3 are formed in the memory cell string because of the word line voltages.

Furthermore, the channel voltage of the second channel CH2 is boosted, and so the $29^{th}$ memory cell C29 coupled to the $29^{th}$ word line WL 29 may be program-inhibited.

When a program operation is performed, in the case where word line voltages are supplied as shown in FIG. 2, the program states of surrounding memory cells have a great influence on channel boosting.

For example, it is assumed that the $29^{th}$ memory cell C29 is an erase cell that has not been programmed.

A third pass voltage Vpass3 is supplied to the gate (that is, the $25^{th}$ word line WL25) of the $25^{th}$ memory cell C25. For a normal operation, a channel voltage of the second channel CH2 can be sufficiently boosted only when the $25^{th}$ memory cell C25 is turned off.

The $25^{th}$ memory cell C25 is in the erase state. When the channel voltage of the second channel CH2 is raised through boosting, the $25^{th}$ memory cell C25 is turned off. Accordingly, the first and second channels CH1, CH2 are separated from each other, the channel voltage of the second channel CH2 is raised, and so the $29^{th}$ memory cell C29 is program-inhibited.

Here, if the $25^{th}$ memory cell C25 is excessively erased at 0 V or less, the $25^{th}$ memory cell C25 is not turned off, but may remain turned on during the channel boosting process.

When the $25^{th}$ memory cell C25 is turned on, charge sharing is generated in the second channel CH2. If the channel voltage of the second channel CH2 is lowered by such charge sharing, a sufficient boosting effect is not obtained. In other words, the $29^{th}$ memory cell C29 may be programmed.

Accordingly, when memory cells are erased, it is desirable to control the memory cells so that they are not excessively erased at 0 V or less.

BRIEF SUMMARY

Exemplary embodiments relate to an erase method that prevents a threshold voltage of a memory cell from dropping to 0 V or less when erasing the memory cell in a semiconductor memory device.

An exemplary method of erasing a semiconductor memory device according to an aspect of this disclosure includes grouping a plurality of word lines of each memory block into at least two groups based on intensity of disturbance between neighboring word lines, performing an erase operation by applying a ground voltage to all word lines of a selected memory block and by applying an erase voltage to a well of the selected memory block, and first increasing the ground voltage of one group of the groups to a positive voltage during the erase operation.

A method of erasing a semiconductor memory device according to another aspect of this disclosure includes grouping a plurality of word lines of each memory block into at least two groups based on intensity of disturbance between neighboring word lines, performing an erase operation by applying a ground voltage to all word lines of a selected memory block and by applying an erase voltage to a well of the selected memory block, and increasing the ground voltage of a first and a second group of the groups to a first and a second positive voltage at the same time, respectively, during the erase operation.

A method of erasing a semiconductor memory device according to yet another aspect of this disclosure includes grouping a plurality of word lines, included in a memory block of the semiconductor memory device, into a plurality of word line groups, performing an erase operation on the memory block, performing a first post-program operation, which supplies all the word lines with program voltages according to the first number of program pulses, after performing the erase operation, and performing a second post-program operation, which supplies any one of the plurality of word line groups with program voltages according to the second number of program pulses.

In the first and second post-program operations, when there is at least one memory cell having a threshold voltage of 0 V or higher, from among memory cells coupled to first and second word lines of the plurality of word lines, the post-program operations may be stopped.

The method may further include a third post-program operation, which supplies a third number of program pulses to another of the remaining word line groups other than the word line group to which the second number of program pulses is supplied, after the second post-program operation.

BRIEF DESCRIPTION OF THE DRAWINGS

FIG. 1 is a cross-sectional view of a unit memory cell string of a nonvolatile memory device;

FIG. 2 is a diagram illustrating a state in which channel boosting is generated when voltage is supplied to a program-inhibited memory cell string in order to describe a program disturbance phenomenon generated due to an erase cell;

FIG. 3 shows the structure of memory cell strings included in the memory block of a semiconductor memory device in order to describe an exemplary embodiment of this disclosure;

FIG. 4 shows the structure of memory cell strings different from the memory cell strings of FIG. 3;

DESCRIPTION OF EMBODIMENTS

Figure 5A:
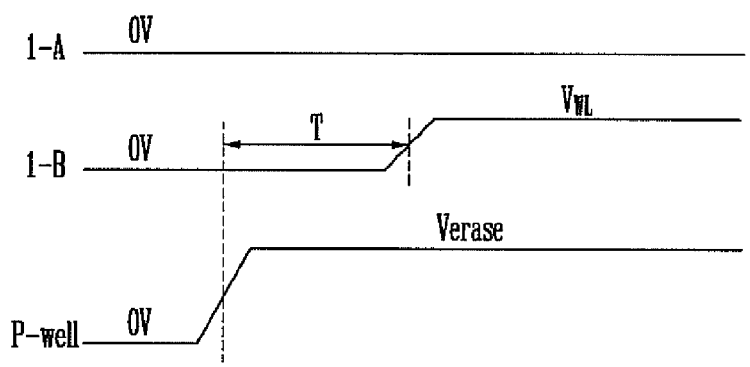
FIGS. 5A to 5C are timing diagrams illustrating an erase method according to a first exemplary embodiment of this disclosure.

Hereinafter, some exemplary embodiments of the present disclosure will be described in detail with reference to accompanying drawings. The figures are provided to allow those having ordinary skill in the art to understand the scope of the embodiments of the disclosure.

FIG. 3 shows the structure of memory cell strings included in the memory block of a semiconductor memory device in order to describe an exemplary embodiment of this disclosure.

The memory cell array of the semiconductor memory device may include a plurality of memory blocks (not shown). Each of the memory blocks includes a plurality of memory cell strings. FIG. 3 shows the memory cell strings included in each of the memory blocks. In particular, the memory cell strings of FIG. 3 are coupled to an even bit line BLe and an odd bit line BLo.

Each of the memory cell strings includes $0^{th}$ to $31^{st}$ memory cells C0 to C31 coupled in series between a drain select transistor DST and a source select transistor SST.

The $0^{th}$ to $31^{st}$ memory cells C0 to C31 are respectively coupled to $0^{th}$ to $31^{st}$ word lines WL0 to WL31, and a drain select line DSL is coupled to the gate of the drain select transistor DST.

Furthermore, a source select line SSL is coupled to the gate of the source select transistor SST.

The drain of the drain select transistor DST is coupled to the bit line BLe or BLo, and the source of the source select transistor SST is coupled to a common source line SL.

In general, the even bit line BLe and the odd bit line BLo are coupled to the same page buffer (not shown). When a memory cell string coupled to the even bit line BLe or the odd bit line BLo is selected for a program operation, a memory cell string coupled to the other bit line BLe or BLo is program-inhibited.

FIG. 4 shows the structure of memory cell strings different from the memory cell strings of FIG. 3.

In FIG. 4, elements similar to those in FIG. 3 are assigned the same reference numerals.

Referring to FIG. 4, a drain dummy cell DDC is coupled between a drain select transistor DST and a $31^{st}$ memory cell C31. A source dummy cell SDC is coupled between a source select transistor SST and a $0^{th}$ memory cell C0.

A drain dummy word line DPWL is coupled to the gate of the drain dummy cell DDC, and a source dummy word line SPWL is coupled to the gate of the source dummy cell SDC.

The drain dummy cell DDC and the source dummy cell SDC have the same structure as the $0^{th}$ to $31^{st}$ memory cells C0 to C31, but are not used for data storage.

The semiconductor memory device performs an erase operation for every memory block including the memory cell strings, such as those shown in FIGS. 3 and 4.

In general, data stored in the memory cells of a memory block is erased by supplying an erase voltage to the well of the memory block with 0 V being supplied to all word lines.

Accordingly, the threshold voltages of the memory cells are changed to 0 V or less.

A process of changing the threshold voltages of the memory cells to 0 V or less is called erasure or an erase operation.

Generally, in an erase operation, it is preferred that the threshold voltages of the memory cells be changed to 0 V or less. However, for the purpose of performing a subsequent program operation it is preferred that the threshold voltages of the memory cells are close to 0 V.

Therefore, with a subsequent program operation in mind, the erase operation is performed in a manner such that the threshold voltages of the memory cells are not lowered too much below 0 V.

In the first exemplary embodiment of this disclosure, memory cells are prevented from being excessively erased by using a method of classifying the word lines of a memory block into a plurality of groups and of floating the memory block for every group or supplying a low voltage to the memory block when erasing the memory block.

Table 1 below shows an example in which the word lines of the memory block are classified into groups

TABLE 1

|  | CASE 1 | CASE 2 | CASE 3 | CASE 4 |
|---|---|---|---|---|
| WL31 | $1^{st}$ group (1-A) | $1^{st}$ group (2-A) | $1^{st}$ group (3-A) | $1^{st}$ group (4-A) |
| WL30 | $2^{nd}$ group (1-B) | $3^{rd}$ group (2-C) | $4^{th}$ group (3-D) | $5^{th}$ group (4-E) |
| WL29 |  |  |  |  |
| WL28 |  |  |  | $4^{th}$ group (4-D) |
| WL27 |  |  | $3^{rd}$ group (3-C) |  |
| WL26 |  | $2^{nd}$ group (2-B) |  | $3^{rd}$ group (4-C) |
| WL25 |  |  |  |  |
| WL24 |  |  | $2^{nd}$ group (3-B) | $2^{nd}$ group (4-B) |
| WL23 |  |  |  |  |
| WL22 |  |  |  |  |
| WL21 | $1^{st}$ group (1-A) | $1^{st}$ group (2-A) | $1^{st}$ group (3-A) | $1^{st}$ group (4-A) |
| ... |  |  |  |  |
| WL1 |  |  |  |  |
| WL0 |  |  |  |  |

Table 1 lists four cases Case 1 to Case 4 in which the $0^{th}$ to $31^{st}$ word lines WL0 to WL31 of the memory block are classified into groups.

In the four cases Case 1 to Case 4, a common feature in the method of grouping the word lines is that word lines close to the drain select transistor DST are classified into several groups.

In the first case (Case 1), the word lines adjacent to the drain select transistor DST, except for the $31^{st}$ word line WL31, (i.e., the $22^{nd}$ to $30^{th}$ word lines WL22 to WL30) are classified as one group (that is, the second group 1-B), and the remaining word lines (i.e., the $0^{th}$ to $21^{st}$ and the $31^{st}$ word lines WL0 to WL21 and WL31) are classified as the other group (that is, the first group 1-A).

In the second case (Case 2), the $22^{nd}$ to $26^{th}$ word lines WL22 to WL26 and the $27^{th}$ to $30^{th}$ word lines WL27 to WL30 are classified into different groups (that is, the second group 2-B and the third group 2-C), and the remaining word lines are classified as another group (that is, the first group 2-A).

In the third case (Case 3), the $22^{nd}$ to $24^{th}$ word lines WL22 to WL24 are classified as a group (that is, the second group 3-B), the $25^{th}$ to $27^{th}$ word lines WL25 to WL27 are classified as a group (that is, the third group 3-C), and the $28^{th}$ to $30^{th}$ word lines WL28 to WL30 are classified as a group (that is, the fourth group 3-D), Furthermore, the remaining word lines are classified as a group (that is, the first group 3-A).

In the fourth case (Case 4), the $22^{nd}$ to $24^{th}$ word lines WL22 to WL24 are classified as a group (that is, the second group 4-B), the $25^{th}$ and $26^{th}$ word lines WL25, WL26 are classified as a group (that is, the third group 4-C), the $27^{th}$ and $28^{th}$ word lines WL27, WL28 are classified as a group (that is, the fourth group 4-D), the $29^{th}$ and $30^{th}$ word lines WL29, WL30 are classified as a group (that is, the fifth group 4-E), and the remaining word lines are classified as a group (that is, the first group 4-A).

In order to develop these cases, a process of classifying the word lines in which a threshold voltage in an erase state functions as a factor to generate disturbance through a test for every memory chip and then classifying the word lines into the groups is performed.

The test for the intensity of disturbance on the word lines is already known in the wafer test, and thus, a detailed description thereof is omitted. Furthermore, where the test determines that the threshold voltage of an erase cell is too low, word lines are grouped by taking word lines, having the greatest intensity of disturbance when a program is performed, into consideration. Furthermore, with an increase in the intensity of disturbance, more detailed groups can be classified.

The word lines may be grouped according to various methods as shown in Table 1, and a low voltage is supplied to one or more of the groups when a memory block is erased. When erasing a memory block, the threshold voltage of a memory cell can be controlled because the erase speed is reduced.

Figure 5B:
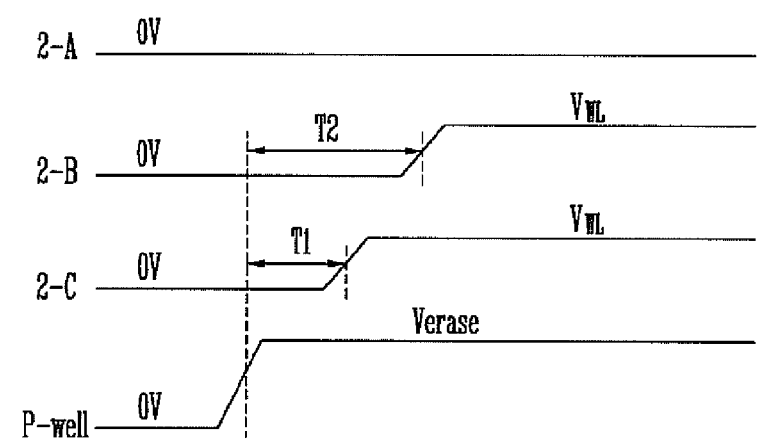
Figure 5C:
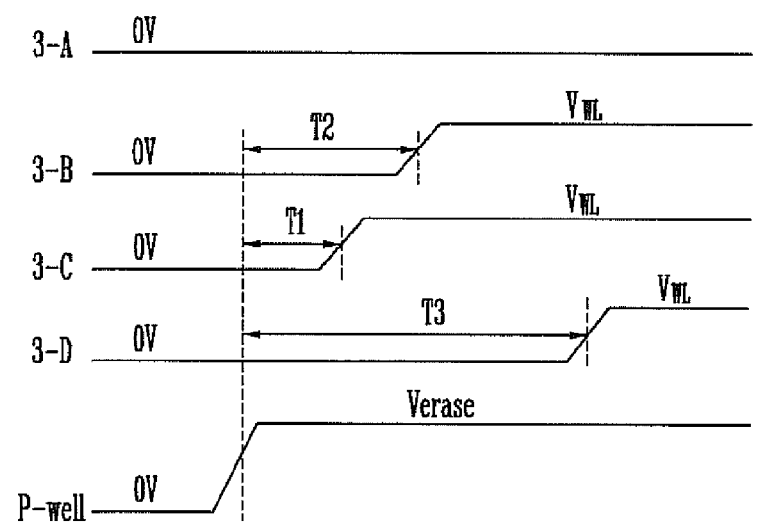

FIGS. 5A to 5C are timing diagrams illustrating an erase method according to a first exemplary embodiment of this disclosure.

FIG. 5A shows voltages supplied to word lines when an erase operation is performed, in the case in which the word lines are grouped according to the first case (Case 1) of Table 1. FIG. 5B shows voltages supplied to word lines when an erase operation is performed, in the case in which the word lines are grouped according to the second case (Case 2) of Table 1. FIG. 5C shows voltages supplied to word lines when an erase operation is performed, in the case in which the word lines are grouped according to the third case (Case 3) of Table 1.

Referring to FIG. 5A, when the word lines are grouped as in the first case (Case 1) of Table 1, 0 V is supplied to all the word lines and the P-well of the memory block, for the erase operation. In the state in which 0 V is supplied to all the word lines, the voltage is raised, and an erase voltage Verase is supplied to the P well.

After a certain time T lapses, a voltage $Vw_L$ is supplied to the word lines of the second group 1-B. The voltage $Vw_L$ is higher than 7 V and is determined as a voltage level which prevents memory cells from being erased by the erase voltage supplied to the P well.

When the voltage $Vw_L$ is supplied, erasure for the second group 1-B is stopped. Accordingly, the threshold voltages of memory cells coupled to the word lines of the second group 1-B can be prevented from dropping too far below 0 V. The time T may be differently set according to a characteristic of word lines influenced by disturbance.

FIG. 5B shows voltages supplied to word lines when an erase operation is performed, in the case where the word lines are grouped as in the second case (Case 2) of Table 1. It is assumed that the third group 2-C has a greater intensity of disturbance than the second group 2-B.

When an erase operation is started, 0 V is supplied to all the word lines. After a first time T1 elapses from a time at which an erase voltage Verase is supplied, a voltage $Vw_L$ is supplied to the third group 2-C.

Furthermore, after a second time T2 elapses from a time at which the erase voltage Verase is supplied, the voltage $Vw_L$ is supplied to the second group 2-B. Accordingly, the third group 2-C may be less erased than the second group 2-B. In other words, the threshold voltages of memory cells corresponding to word lines in the first group 2-A are lowered more than the threshold voltages of memory cells corresponding to word lines in the second group.

In the third case (Case 3) of Table 1, word line voltages may be changed as shown in FIG. 5C. It is assumed that in the third case (Case 3), the third group 3-C has the greatest intensity of disturbance, the second group 3-B has the second greatest intensity of disturbance, and the fourth group 3-D has a less intensity of disturbance than the second and third groups 3-B, 3-D.

When an erase operation is started, 0 V is supplied to all the word lines. Furthermore, an erase voltage Verase is supplied to the P well.

After a first time T1 elapses, a voltage $Vw_L$ is supplied to the word lines of the third group 3-C. Furthermore, after a second time T2 elapses, the voltage $Vw_L$ is supplied to the word lines of the second group 3-B. Furthermore, after a third time T3 elapses, the voltage $Vw_L$ is supplied to the word lines of the fourth group 3-D.

Through erase operations, such as those shown in FIGS. 5A to 5C, memory cells coupled to word lines having a greater intensity of disturbance according to the threshold voltage of an erase cell, can be prevented from being excessively erased to 0 V or less. Accordingly, the intensity of disturbance according to the threshold voltage of an erase cell can be reduced.

Although FIGS. 5A and 5B show that the same voltage $Vw_L$ is supplied to the word line groups, the voltage level of the voltage $Vw_L$ may be different for every group according to the degree of intensity of disturbance. For example, a higher voltage $Vw_L$ may be supplied to a group having a greater intensity of disturbance.

If a different voltage $Vw_L$ is supplied for every word line group, a point of time at which the voltage is supplied may be the same.

Meanwhile, unlike the method of supplying the voltage $Vw_L$ to the word lines while the erase voltage is supplied as in the first exemplary embodiment of this disclosure, memory cells can be prevented from being excessively erased by supplying more program pulses to word lines, having a greater intensity of disturbance than other word lines, when a post program operation is performed after an erase operation.

Figure 6A:
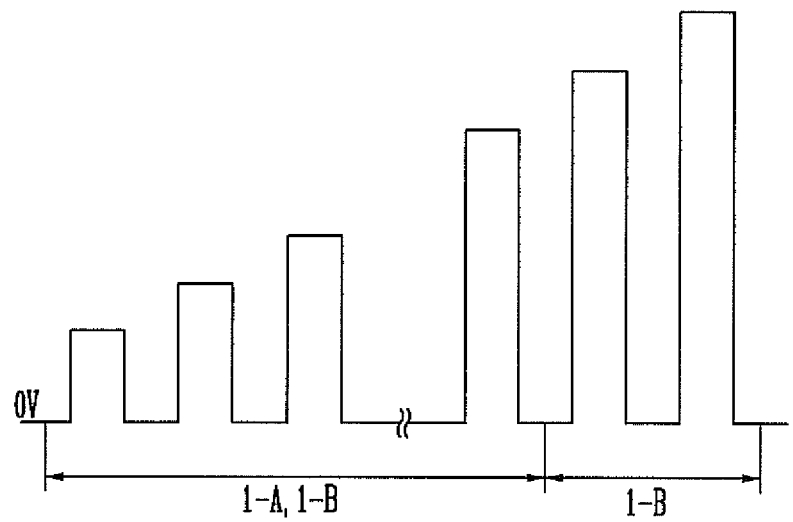
FIGS. 6A and 6B are timing diagrams illustrating an erase method according to a second exemplary embodiment of this disclosure.
Figure 6B:
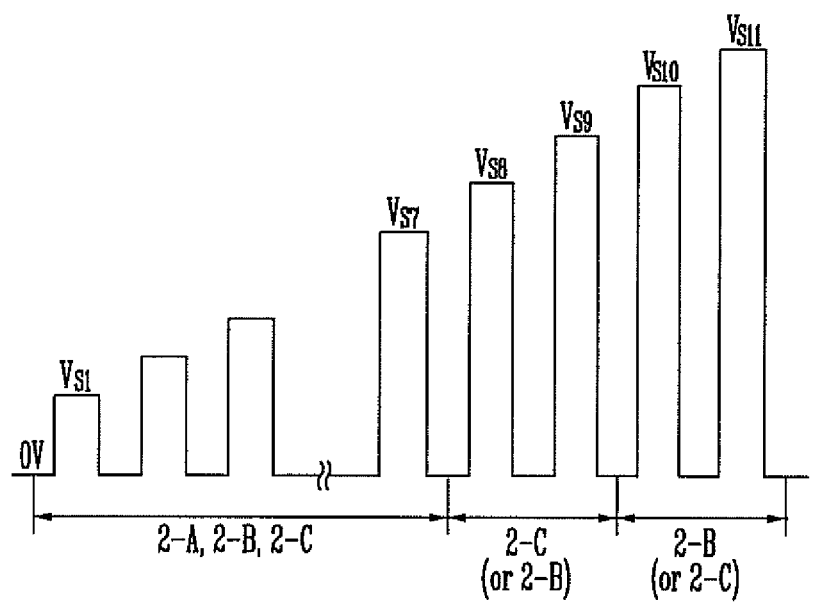

FIGS. 6A and 6B are timing diagrams illustrating an erase method according to a second exemplary embodiment of this disclosure.

FIGS. 6A and 6B show program voltages supplied to word lines when a post-program operation included in an erase operation is performed. In particular, FIG. 6A corresponds to the first case (Case 1) of Table 1, and FIG. 6B corresponds to the second case (Case 2) of Table 1.

FIGS. 6A and 6B show program voltages supplied to word lines in a post-program operation performed to raise the threshold voltage of a memory cell close to 0 V after erasure, in which an erase voltage Verase is supplied to the P well of the memory block and 0 V is supplied to all the word lines, is performed.

Referring to FIG. 6A, for a post-program, the same program voltage is supplied to all the word lines according to an increment step pulse program (ISPP) method. When program pulses are supplied, the program voltage is raised by a step voltage.

FIG. 6A shows only the program voltages supplied for the post-program, but does not show voltages for performing program verification.

In the second exemplary embodiment of this disclosure, the program voltages are supplied to the second group 1-B, having a greater intensity of disturbance, a specific number of times more. As shown in FIG. 6A, first, the program voltages are supplied to the first and second groups 1-A, 1-B. The program voltage is incrementally raised by a step voltage.

When the specific number of times is reached, the program voltage is no longer supplied to the first group 1-A, and thus, is only supplied to the second group 1-B. Accordingly, memory cells coupled to the word lines of the second group 1-B may be programmed with threshold voltages closer to 0 V than the threshold voltages of memory cells coupled to the word lines of the first group 1-A.

As in FIG. 6A, in FIG. 6B, more program voltages are supplied to the second and third groups 2-B, 2-C having a relatively greater intensity of disturbance. The sequence that the program voltages are supplied may be controlled according to which group has a greater intensity of disturbance.

For example, it is assumed the basic number of program pulses is 7 and the number of times that the program pulses are further supplied is 2. It is also assumed that program voltages Vs1, Vs2, Vs3 . . . Vs11 are supplied when the respective program pulses are supplied and that the program voltages Vs1, Vs2, etc. incrementally increase by a step voltage.

Referring to FIG. 6B, first, the same program voltages, beginning with the start voltage Vs1, are supplied to the first to third groups 2-A, 2-B, and 2-C.

After a program voltage Vs7 according to a seventh program pulse is supplied, the program pulses are supplied to the third group 2-C twice. Accordingly, the eighth and ninth program voltages Vs8 and Vs9, each raised by the step voltage, are supplied to the third group 2-C.

After the eighth and ninth program pulses are supplied to the third group 2-C, more program pulses are supplied to the second group 2-B. More specifically, the tenth and eleventh program voltages Vs10 and Vs11 are supplied to the second group 2-B.

The reason why the program pulses are first supplied to the third group 2-C and then supplied to the second group 2-B is that the second group 2-B may have a greater intensity of disturbance than the third group 2-C.

If the third group 2-C has a greater intensity of disturbance than the second group 2-B, the program pulses may be further supplied to the second group 2-B and then supplied to the third group 2-C.

According to a post-program method, such as that shown in FIGS. 6A and 6B, memory cells coupled to word lines, having a greater intensity of disturbance, are more post-programmed than other memory cells. That is, the threshold voltages of the memory cells are controlled so that they become closer to 0 V.

The post-program is a program operation for making the threshold voltages of memory cells close to 0 V, after the threshold voltages of the memory cells are erased to 0 V or less. The post-program is performed at the same time by supplying the same program voltage to all the word lines.

Furthermore, in a program verification operation performed according to the post-program, if at least one memory cell is determined to have a threshold voltage of 0 V or higher, the memory cell is determined to be a program pass.

In the second exemplary embodiment of this disclosure, not only a post-program and verification are performed by supplying the same program voltage to all word lines, but also a program operation is performed by further supplying post-program pulses to a word line group, determined to have a greater intensity of disturbance, by the specific number of times. In the post-program voltages of FIGS. 6A and 6B, program verification voltages are not shown.

The process of grouping the word lines may be likewise applied to the memory block including the dummy cells DDC, SDC shown in FIG. 4.

In the first and second exemplary embodiments of this disclosure, the threshold voltages of memory cells, coupled to word lines determined to have a greater intensity of disturbance, are controlled in an erase state. Accordingly, the intensity of disturbance generated in a channel boosting process in a program operation after erasure can be reduced.

In the method of erasing a semiconductor memory device according to the exemplary embodiments of this disclosure, the threshold voltage of an erase cell can be prevented from dropping too far below 0 V. Accordingly, the intensity of disturbance that may occur because the threshold voltage of the erase cell is too low when a program operation is performed can be reduced.

What is claimed is:

1. A method of erasing a semiconductor memory device, the method comprising:
   grouping a plurality of word lines of each memory block into at least two groups based on intensity of disturbance between neighboring word lines;
   performing an erase operation by applying a ground voltage to all word lines of a selected memory block and by applying an erase voltage to a well of the selected memory block; and
   first increasing the ground voltage of one group of the groups to a positive voltage during the erase operation.

2. The method of claim 1, wherein the one group of the groups is the group that is most affected by disturbance.

3. The method of claim 1, further comprising:
   second increasing the ground voltage of a remaining group to a positive voltage after first increasing the ground voltage to the positive voltage.

4. The method of claim 1, wherein the intensity of disturbance is determined by measuring a channel boosting voltage of a memory cell associated with a selected word line.

5. The method of claim 1, wherein the groups comprise:
   a first group including word lines which are adjacent to source and drain select lines of the selected memory block; and
   a second group including word lines excepting the word lines of the first group of the selected memory block.

6. The method of claim 5, wherein the second group comprises one or more groups.

7. The method of claim 3, wherein the positive voltage is applied sequentially in order of the group which is most affected by disturbance.

* * * * *